(12) United States Patent
Jeong et al.

(10) Patent No.: US 9,559,328 B2
(45) Date of Patent: Jan. 31, 2017

(54) ORGANIC LIGHT-EMITTING DISPLAY APPARATUS AND METHOD OF MANUFACTURING THE SAME

(71) Applicant: Samsung Display Co., Ltd., Yongin (KR)

(72) Inventors: Changoh Jeong, Yongin (KR); Hyuneok Shin, Yongin (KR); Sukyoung Yang, Yongin (KR); Chanwoo Yang, Yongin (KR); Dongmin Lee, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/738,810

(22) Filed: Jun. 12, 2015

(65) Prior Publication Data
US 2016/0155982 A1 Jun. 2, 2016

(30) Foreign Application Priority Data

Dec. 2, 2014 (KR) .................. 10-2014-0170828

(51) Int. Cl.
*H01L 51/52* (2006.01)
(52) U.S. Cl.
CPC ..... *H01L 51/5215* (2013.01); *H01L 2251/301* (2013.01); *H01L 2251/306* (2013.01); *H01L 2251/308* (2013.01)

(58) Field of Classification Search
CPC .. H01L 51/5218; H01L 51/5215; H01L 51/56; H01L 51/5221
See application file for complete search history.

(56) References Cited

U.S. PATENT DOCUMENTS

| 5,705,097 A | 1/1998 | Suzuki et al. |
| 2011/0278615 A1 | 11/2011 | No et al. |
| 2012/0001182 A1 | 1/2012 | Choi et al. |
| 2012/0104396 A1 | 5/2012 | Pyo |
| 2013/0015458 A1* | 1/2013 | Ko ............... H01L 27/3262 257/71 |
| 2014/0138639 A1* | 5/2014 | Kim ............... H01L 51/5218 257/40 |

FOREIGN PATENT DOCUMENTS

| KR | 10-2011-0126379 | 11/2011 |
| KR | 10-2012-0003166 | 1/2012 |
| KR | 10-2012-0044023 | 5/2012 |

* cited by examiner

*Primary Examiner* — Mamadou Diallo
(74) *Attorney, Agent, or Firm* — H.C. Park & Associates, PLC

(57) ABSTRACT

Provided is an organic light-emitting display apparatus including a substrate; a first electrode formed on the substrate; an emission layer formed on the first electrode; and a second electrode formed on the emission layer, wherein the first electrode includes a first layer including silver (Ag); and a second layer disposed on the first layer and comprising oxide of non-silver metal.

19 Claims, 6 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority from and the benefit of Korean Patent Application No. 10-2014-0170828, filed on Dec. 2, 2014, which is hereby incorporated by reference for all purposes as if fully set forth herein.

BACKGROUND

Field

Exemplary embodiments relate to an organic light-emitting display apparatus and a method of manufacturing the same.

Discussion of the Background

An organic light-emitting display apparatus is a self-emissive display apparatus including a hole injection electrode and an electron injection electrode, and an emission layer formed therebetween, in which holes injected from the hole injection electrode and electrons injected from the electron injection electrode are re-combined in the emission layer so that light is emitted therefrom. The organic light-emitting display apparatus is expected to become a next generation display apparatus due to its high quality characteristic such as low power consumption, high contrast, a fast response time, etc.

SUMMARY

Exemplary embodiments provide an organic light-emitting display apparatus having an improved yield rate and manufacturing method thereof.

Additional aspects will be set forth in the detailed description which follows, and, in part, will be apparent from the disclosure, or may be learned by practice of the inventive concept.

According to exemplary embodiments, an organic light-emitting display apparatus includes a substrate; a first electrode formed on the substrate; an emission layer formed on the first electrode; and a second electrode formed on the emission layer, wherein the first electrode includes a first layer including silver (Ag); and a second layer disposed on the first layer and including an oxide of a non-silver metal.

The non-silver metal may include at least one selected from antimony (Sb) and bismuth (Bi).

The organic light-emitting display apparatus may further include a third layer that is formed between the first layer and the second layer and includes the non-silver metal corresponding to the oxide of the non-silver metal included in the second layer.

The organic light-emitting display apparatus may further include a first protective layer that is formed between the substrate and the first layer and includes transparent conductive oxide.

The first protective layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The organic light-emitting display apparatus may further include a second protective layer that is formed between the second layer and the emission layer and includes transparent conductive oxide.

The second protective layer may include at least one material selected from the group consisting of ITO, IZO, ZnO, $In_2O_3$, IGO, and AZO.

The first layer may comprise the silver and the non-silver metal alloy, and the non-silver metal may include at least one selected from antimony (Sb) and bismuth (Bi).

The second electrode may be a reflective electrode.

Light that is emitted from the emission layer may be discharged toward the substrate.

The second electrode may be a transparent electrode.

Light that is emitted from the emission layer may be discharged away from the substrate.

The first electrode may be an anode, and the second electrode may be a cathode.

According to another exemplary embodiments, a method of manufacturing an organic light-emitting display apparatus includes operations of forming a layer including silver on a substrate; forming a layer including a non-silver metal on the layer including silver; forming a protective layer including transparent conductive oxide on the layer including the non-silver metal; forming an emission layer on the protective layer; forming a second electrode on the emission layer; and forming, by performing a thermal treatment, a layer including an oxide of the non-silver metal between the protective layer and the layer including the non-silver metal.

The layer including the non-silver metal may include at least one selected from antimony (Sb) and bismuth (Bi).

The method may further include an operation of forming a layer including a transparent conductive oxide between the substrate and the layer including silver.

According to one another exemplary embodiments, a method of manufacturing an organic light-emitting display apparatus includes operations of forming a layer including an alloy of silver and a non-silver metal on a substrate; forming a protective layer including a transparent conductive oxide on the layer including the alloy; forming an emission layer on the protective layer; forming a second electrode on the emission layer; and forming, by performing a thermal treatment, a layer including an oxide of the non-silver metal between the protective layer and the layer including the alloy.

The non-silver metal of the alloy may include at least one selected from antimony (Sb) and bismuth (Bi).

The method may further include an operation of forming a layer including a transparent conductive oxide between the substrate and the layer including the alloy.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
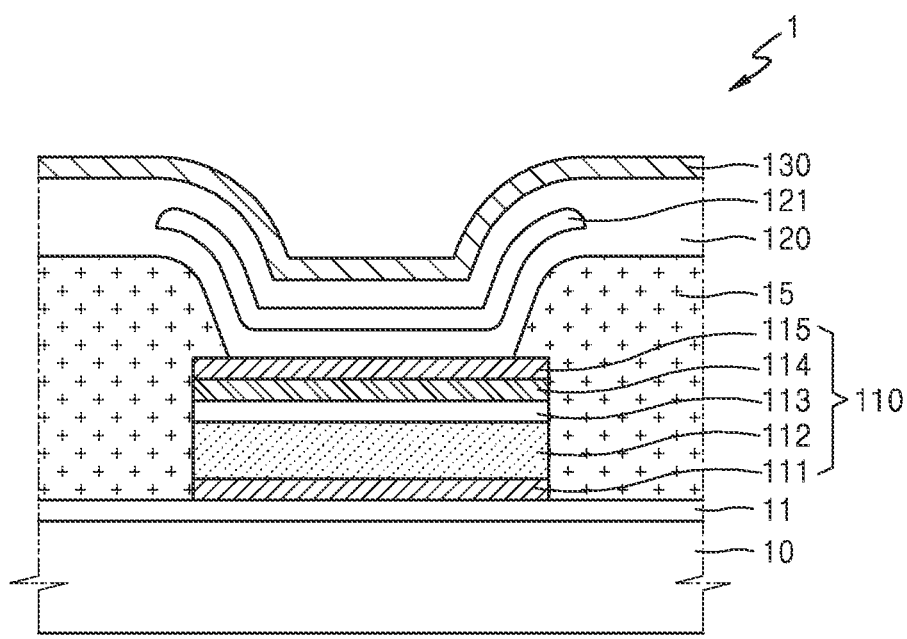
FIG. 1 is a cross-sectional view of an organic light-emitting display apparatus according to a first exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view of an organic light-emitting display apparatus 1 according to a first exemplary embodiment.

Referring to FIG. 1, a buffer layer 11, a first electrode 110, an intermediate layer 120 including an emission layer 121, and a second electrode 130 are arranged on a substrate 10 of the organic light-emitting display apparatus 1 according to the first exemplary embodiment. That is, the buffer layer 11, the first electrode 110, the intermediate layer 120 including the emission layer 121, and the second electrode 130 may be sequentially stacked on the substrate 10.

The substrate 10 may be formed as a transparent substrate including a glass substrate or a plastic substrate including polyethylene terephthalate (PET), polyethylene naphthalate (PEN), polyimide, or the like.

The buffer layer 11 may be further arranged on the substrate 10 so as to form a planar surface on the substrate 10 and to prevent penetration of foreign substances. The buffer layer 11 may be formed as a single layer or multiple layers including silicon nitride and/or silicon oxide.

Although not illustrated in FIG. 1, a plurality of thin-film transistors (TFTs) may be arranged between the buffer layer 11 and the first electrode 110. A driving TFT of the plurality of TFTs may apply current to the first electrode 110, and thus, drives an organic light-emitting device in each pixel. Specifically, the organic light-emitting display apparatus 1 may include a plurality of pixels, and each of the pixels may have the driving TFT and the organic light-emitting device.

In the present embodiment, the first electrode 110 includes a first protective layer 111, a first layer 112, a third layer 113, a second layer 114, and a second protective layer 115.

The first layer 112 may be formed as a transflective metal layer including silver (Ag) or a silver alloy and having a thickness between about 100 and about 300 Å.

The first protective layer 111 including transparent conductive oxide may be formed between the buffer layer 11 and the first layer 112.

The first protective layer 111 may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The first protective layer 111 may reinforce adhesion between the first layer 112 and the buffer layer 11, and may prevent impurity from diffusing to the first layer 112.

Referring to FIG. 1, the first protective layer 111 directly contacts the buffer layer 11, but one or more exemplary embodiments are not limited thereto. For example, the buffer layer 11 and a plurality of insulating layers may be formed between the substrate 10 and the first protective layer 111, and the first protective layer 111 may directly contact one of the plurality of insulating layers.

The third layer 113 including a non-silver metal may be formed on the first layer 112.

The metal for forming the third layer 113 may be easily oxidized than silver and may have an atomic radius that is less than or is similar to an atomic radius of silver. The third layer 113 may be formed of the metal including at least one selected from antimony (Sb) and bismuth (Bi).

The second layer 114 including oxide of the metal included in the third layer 113 is formed on the third layer 113. For example, the second layer 114 may be formed of antimony oxide (SbOx) or bismuth oxide (BiOx). That is, the second layer 114 is an oxide layer of the third layer 113. The second layer 114 prevents the first layer 112 including silver from agglomerating on the second protective layer 115. Detailed descriptions thereof will be provided later.

The second protective layer 115 is formed on the second layer 114. The second protective layer 115 may include transparent conductive oxide. The second protective layer 115 may include at least one material selected from the group consisting of ITO, IZO, ZnO, $In_2O_3$, IGO, and AZO.

The second protective layer 115 protects the first layer 112 including silver. Also, since the second protective layer 115 is formed of transparent conductive oxide having a high work function, the first electrode 110 including the second protective layer 115 may be used as an anode having a high efficiency.

A pixel defining layer 15 covers edges of the first electrode 110. The pixel defining layer 15 may be formed as an organic insulating layer including polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

The intermediate layer 120 including the emission layer 121 is formed on the first electrode 110.

The emission layer 121 may include a small molecule organic material or a polymer organic material.

If the emission layer 121 includes the small molecule organic material, the intermediate layer 120 may further include a hole transport layer (HTL), a hole injection layer (HIL), an electron transport layer (ETL), or an electron injection layer (EIL). In addition to these layers, if required, the intermediate layer may further include various layers. Here, various organic materials including copper phthalocyanine (CuPc), N'-Di(naphthalene-1-yl)-N,N'-diphenyl-benzidine (NPB), tris-8-hydroxyquinoline aluminum(Alq3), or the like may be used.

If the emission layer 121 includes the polymer organic material, the intermediate layer 120 may further include an HTL. The HTL may be formed of poly-(2,4)-ethylene-dihydroxy thiophene (PEDOT) or polyaniline (PANI). Here, the polymer organic material may include poly-phenylene vinylene (PPV), polyfluorene, or the like. Also, an inorganic material may be further arranged between the emission layer 121 and the first electrode 110 and may be further arranged between the emission layer 121 and the second electrode 130.

The second electrode 130 that is commonly formed in pixels is arranged on the emission layer 121. In the organic light-emitting display apparatus 1 according to the present embodiment, the first electrode 110 is used as an anode and the second electrode 130 is used as a cathode but polarities of electrodes may be switched.

The second electrode 130 may include at least one material selected from Al, Mg, Li, Ca, LiF/Ca, and LiF/Al.

As described above, since the first electrode 110 including the first layer 112 is formed as a transflective metal layer, and the second electrode 130 is formed as a reflective electrode, the organic light-emitting display apparatus 1 may be manufactured as a bottom emission type organic light-emitting display apparatus. That is, light that is emitted from the emission layer 121 may be discharged toward the substrate 10. Here, the first electrode 110 and the second electrode 130 may form a micro-cavity structure and thus may improve a luminescent efficiency of the organic light-emitting display apparatus 1.

Since the first layer 112 is formed as a layer including silver or a silver alloy with a thickness equal to or greater than 500 Å, the first layer 112 may be arranged as a reflective metal layer. That is, if the first electrode 110 including the first layer 112 is formed as a reflective layer, and the second electrode 130 is formed as a transparent electrode, the organic light-emitting display apparatus 1 may be manufactured as a top emission type organic light-emitting display apparatus. That is, light that is emitted from the emission layer 121 may be discharged away from the substrate 10.

Figure 2A:
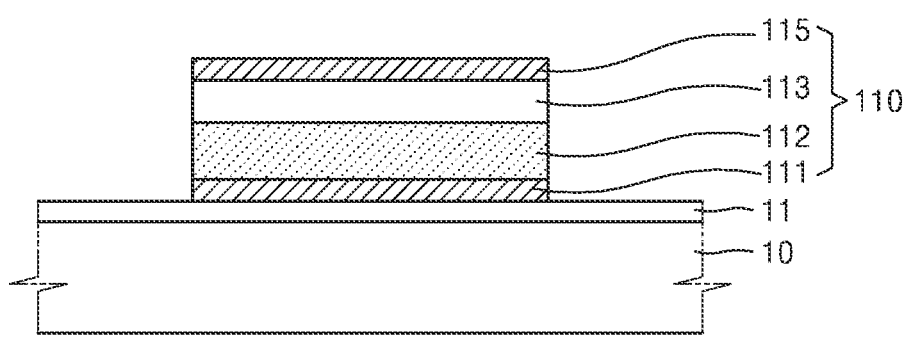
FIGS. 2A and 2B are cross-sectional views that partly illustrate a method of manufacturing the organic light-emitting display apparatus of the first exemplary embodiment.
Figure 2B:
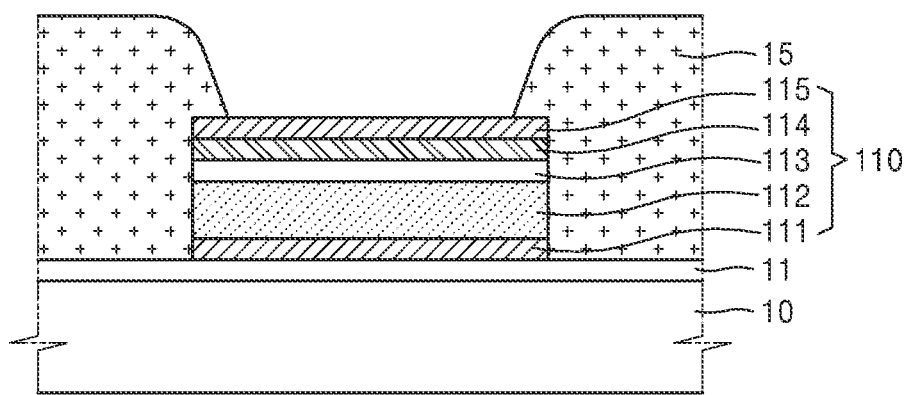

FIGS. 2A and 2B are cross-sectional views that partly illustrate a method of manufacturing the organic light-emitting display apparatus 1 of the first exemplary embodiment.

Referring to FIG. 2A, the buffer layer 11 is formed on the substrate 10. A layer including transparent conductive oxide, a layer including silver, a layer including a non-silver metal, and another layer including transparent conductive oxide are sequentially deposited on the buffer layer 11, and are patterned using a same mask, so that the first electrode 110 including the first protective layer 111, the first layer 112, the third layer 113, and the second protective layer 115 is formed.

Each of the first protective layer 111 and the second protective layer 115 may include at least one material selected from the group consisting of ITO, IZO, ZnO, $In_2O_3$, IGO, and AZO. In an early stage of forming the first electrode 110, each of the first protective layer 111 and the second protective layer 115 has an amorphous structure.

The metal used for the third layer 113 may be easily oxidized than silver and may have an atomic radius that is less than or is similar to an atomic radius of silver. The third layer 113 may be formed of the metal including at least one selected from Sb and Bi.

Referring to FIG. 2B, an organic insulating layer is patterned to form the pixel defining layer 15 covering the edges of the first electrode 110. A thermal treatment process such as a curing when forming the pixel defining layer 15 oxidizes the metal included in the third layer 113 naturally. This forms the second layer 114, which is the oxidized layer of the third layer 113, between the third layer 113 and the second protective layer 115.

Figure 3A:
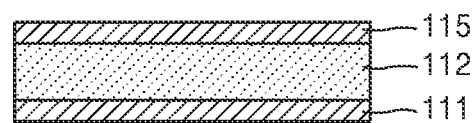
FIGS. 3A and 3B are cross-sectional views of an anode structure, according to a comparative example.
Figure 3B:
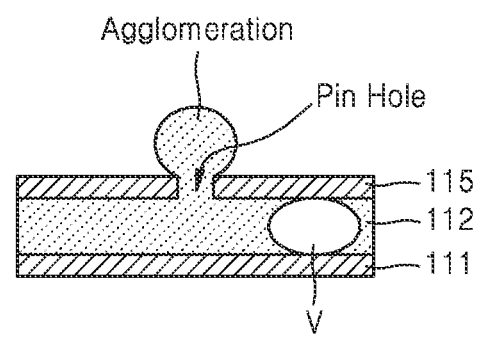

FIGS. 3A and 3B are cross-sectional views of an anode structure, according to a comparative example.

Referring to FIGS. 3A and 3B, the anode structure according to the comparative example includes a first protective layer 111, a first layer 112, and a second protective layer 115. That is, the anode structure according to the comparative example does not include the third layer 113, the second layer 114

As shown in FIG. 3A, a transparent conductive oxide included in the second protective layer 115 is amorphous in an initial stage of forming an anode structure. Afterward, however, the transparent conductive oxide included in the second protective layer 115 goes through a thermal treatment process to crystallize into a polycrystalline transparent conductive oxide, and a pin hole is formed in a surface of the second protective layer 115. Silver or a silver alloy of the first layer 112 under the pin hole forms a void V in the first layer 112, and silver effuses through the pin hole in the surface of the second protective layer 115, such that agglomeration of silver occurs on the second protective layer 115. The agglomeration of silver causes a dark spot defect in an organic light-emitting display apparatus.

However, in the organic light-emitting display apparatus 1 according to the present embodiment, as illustrated in FIG. 1, the third layer 113 that does not include silver, and the second layer 114 that is an oxidized layer of the third layer 113 are further formed on the first layer 112 including silver, so that the third layer 113 and the second layer 114 prevent effusion of the first layer 112 including silver through the surface of the second protective layer 115.

Since silver is highly reducible, it is difficult to form an oxide layer on its surface. In the present embodiment, the third layer 113 including at least one selected from Sb and Bi of the group 15 elements that are easily oxidized than silver and are usable as display apparatus electrodes is formed on the first layer 112 including silver, and then the third layer 113 is oxidized to form the second layer 114 that is an oxide layer. The second layer 114, the oxide layer, prevents silver from effusing through the surface of the second protective layer 115.

Figure 4:
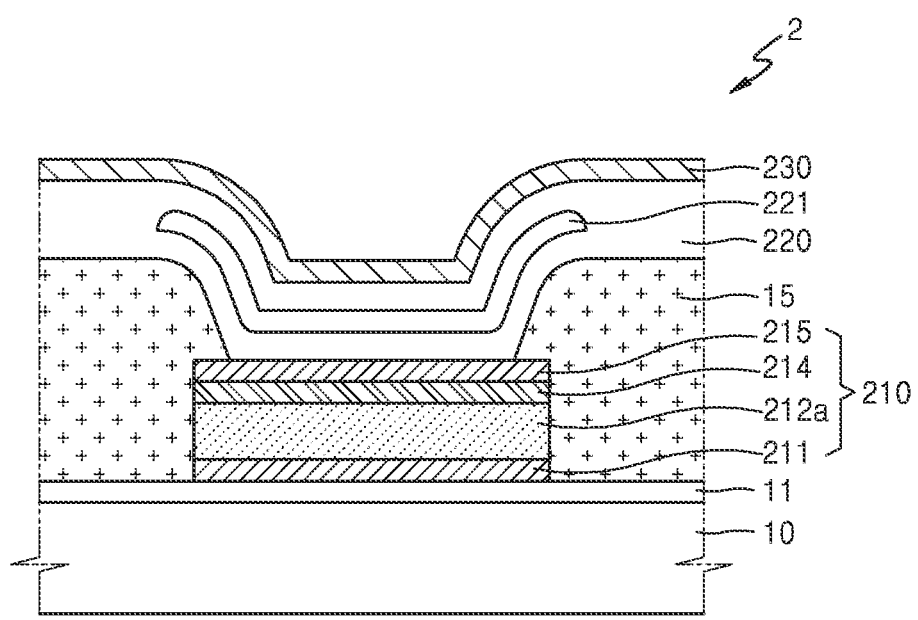
FIG. 4 is a cross-sectional view of an organic light-emitting display apparatus according to a second exemplary embodiment.

FIG. 4 is a cross-sectional view of an organic light-emitting display apparatus 2 according to a second exemplary embodiment.

Referring to FIG. 4, a buffer layer 11, a first electrode 210, an intermediate layer 220 including an emission layer 221, and a second electrode 230 are arranged on a substrate 10 of the organic light-emitting display apparatus 2 according to the second exemplary embodiment.

Hereinafter, the second exemplary embodiment is described focusing on differences from the first exemplary embodiment. Like reference numerals denote like elements.

The substrate 10 may be formed as a transparent substrate including a glass substrate or a plastic substrate including polyethylene terephthalate (PET), polyethylene naphthalate (PEN), polyimide, or the like.

The buffer layer 11 may be further arranged on the substrate 10 so as to form a planar surface on the substrate 10 and to prevent penetration of foreign substances. The buffer layer 11 may be formed as a single layer or multiple layers including silicon nitride and/or silicon oxide.

In the present embodiment, the first electrode 210 includes a first protective layer 211, a first layer 212a, a second layer 214, and a first protective layer 215.

The first protective layer 211 including transparent conductive oxide may be formed between the buffer layer 11 and the first layer 212a. The first protective layer 211 may reinforce adhesion between the first layer 212a and the buffer layer 11, and may prevent impurity from diffusing from the substrate 10 to the first layer 212a.

Referring to FIG. 4, the first protective layer 211 directly contacts the buffer layer 11, but one or more exemplary embodiments are not limited thereto. For example, the buffer layer 11 and a plurality of insulating layers may be formed between the substrate 10 and the first protective layer 211, and the first protective layer 211 may directly contact one of the plurality of insulating layers.

The first layer 212a is formed on the first protective layer 211. The first layer 212a may be formed as a transflective metal layer that includes a silver and non-silver metal alloy and has a thickness between about 100 and about 300 Å.

Here, a metal forming the first layer 212a may be easily oxidized than silver and may have an atomic radius that is less than or is similar to an atomic radius of silver. The first layer 212a may be formed of the metal including at least one selected from Sb and Bi. Thus, the first layer 212a may include an Ag—Sb alloy or an Ag—Bi alloy.

The second layer 214 including a metal oxide excluding silver included in the first layer 212a is arranged on the first layer 212a. For example, the second layer 214 may be formed of antimony oxide (SbOx) or bismuth oxide (BiOx). That is, the second layer 214 is a metal oxide layer excluding silver included in the first layer 212a. The second layer 214 prevents silver of the first layer 212a from agglomerating on the first protective layer 215.

The first protective layer 215 is formed on the second layer 214. The first protective layer 215 includes transparent conductive oxide and protects the first layer 212a including silver. Also, since the first protective layer 215 is formed of transparent conductive oxide having a high work function, the first electrode 210 including the first protective layer 215 may be used as an anode having a high efficiency.

The pixel defining layer 15 including the organic insulating layer covers the edges of the first electrode 210. The intermediate layer 220 including the emission layer 221 is formed on the first electrode 210. The second electrode 230 is formed on the intermediate layer 220. Since materials and structures of the pixel defining layer 15, the emission layer 221, the intermediate layer 220, and the second electrode 230 are the same as those of the embodiment shown in FIG. 1, detailed descriptions thereof are omitted here.

In the organic light-emitting display apparatus 2 according to the present embodiment, the second layer 214, the oxide layer, that is arranged between the first protective layer 215 and the first layer 212a that includes the silver and non-silver metal alloy, prevents silver in the first layer 212a effusing through a surface of the first protective layer 215.

Figure 5A:
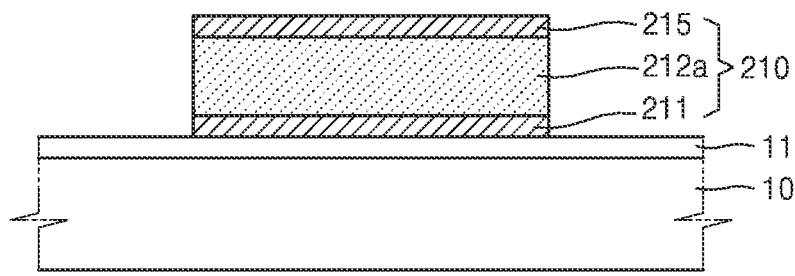
FIGS. 5A and 5B are cross-sectional views that partly illustrate a method of manufacturing the organic light-emitting display apparatus of the second exemplary embodiment.
Figure 5B:
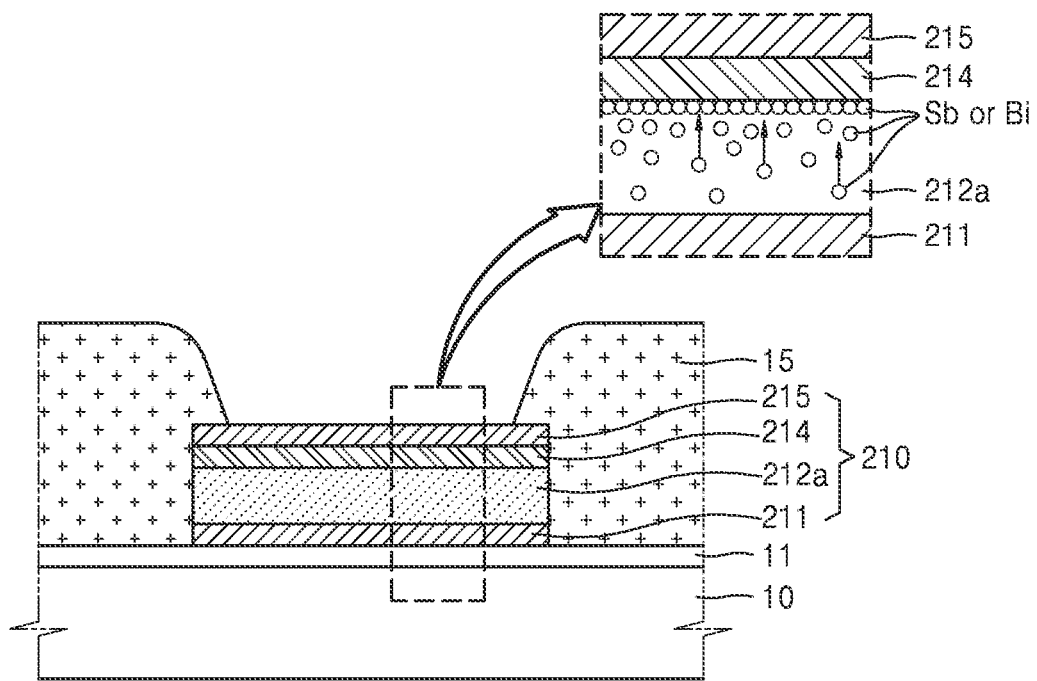

FIGS. 5A and 5B are cross-sectional views that partly illustrate a method of manufacturing the organic light-emitting display apparatus 2 of the second exemplary embodiment, according to an exemplary embodiment.

Referring to FIG. 5A, the buffer layer 11 is formed on the substrate 10. A layer including transparent conductive oxide, a layer including a silver and non-silver metal alloy, and another layer including transparent conductive oxide are sequentially deposited on the buffer layer 11, and are patterned using the same mask, to form the first electrode 210 including the first protective layer 211, the first layer 212a, and the second protective layer 215.

Each of the first protective layer 211 and the second protective layer 215 may include at least one material selected from the group consisting of ITO, IZO, ZnO, $In_2O_3$, IGO, and AZO. In an early stage of forming the first electrode 210, each of the first protective layer 211 and the second protective layer 215 has an amorphous structure.

The first layer 212a is formed of a silver and non-silver metal alloy. The non-silver metal material included in the silver and non-silver metal alloy of the first layer 212a may include metal that is easily oxidized than silver and has an atomic radius that is less than or is similar to an atomic radius of silver. For example, the silver and non-silver metal alloy of the first layer 212a may include at least one selected from Sb and Bi. Thus, the first layer 212a may include an Ag—Sb alloy or an Ag—Bi alloy.

Referring to FIG. 5B, an organic insulating layer is patterned so that the pixel defining layer 15 covering the edges of the first electrode 210 is formed. While a thermal treatment process such as a curing process is performed in a process of forming the pixel defining layer 15, a non-silver metal in the alloy of the first layer 212a effuses to a surface of the first layer 212a. An atomic radius of Sb that is the group 15 element is 1.5 Å that is similar to 1.44 Å of an atomic radius of silver, thus, Sb included in the Ag—Sb alloy effuses to a surface of the Ag—Sb alloy during the thermal treatment process. Similarly, in a case of the Ag—Bi alloy that includes Bi having a similar feature to Sb, Bi effuses to a surface of the Ag—Bi alloy. As a result, in the first layer 212a that is an alloy layer, density of Sb or Bi increases toward the second layer 214.

Sb or Bi that effuses to the surface is naturally oxidized. Thus, the second layer 214 that is an oxide layer of Sb or Bi is formed between the first layer 212a and the second protective layer 215. As described above, the oxide layer is a protective layer for protecting the first layer 212a including silver, and prevents effusion of silver through the surface of the second protective layer 215 and agglomeration of silver on the surface of the second protective layer 215.

Figure 6:
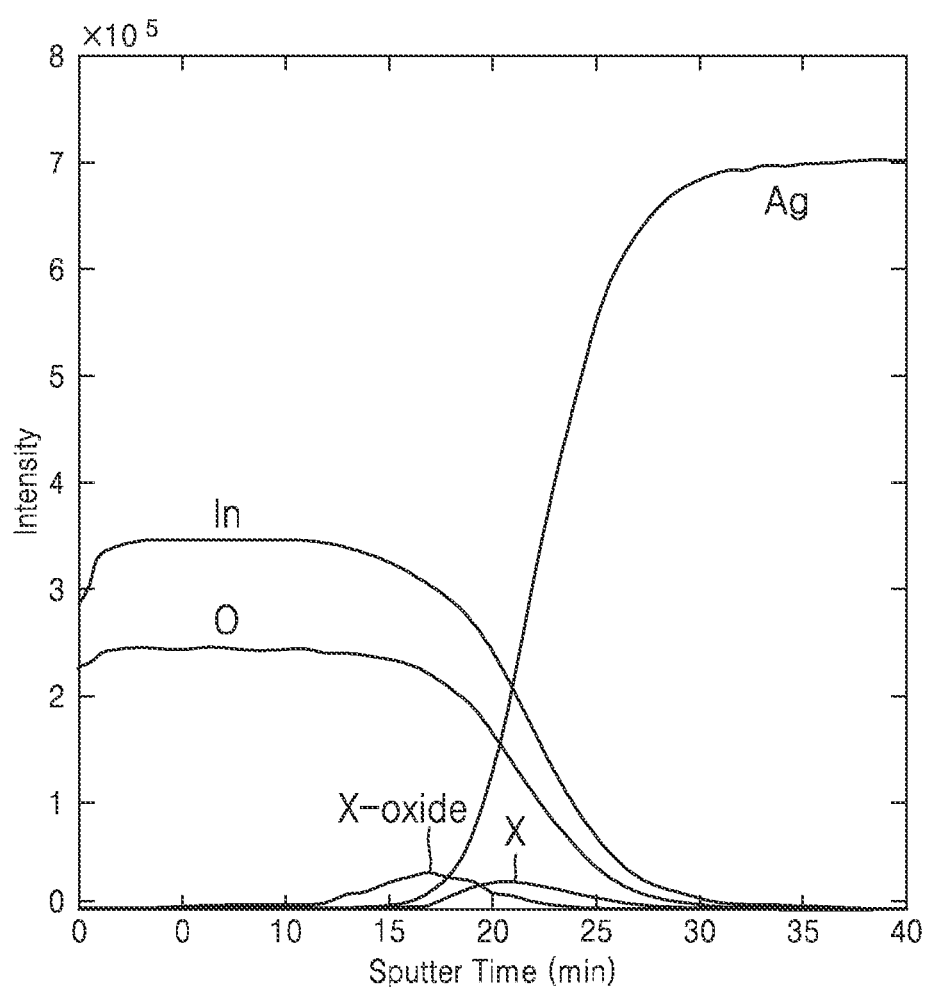
FIG. 6 is a graph that shows intensities of components in a first electrode according to a sputtering time of the organic light-emitting display apparatus shown in FIG. 1.

FIG. 6 is a graph that shows intensities of components in the first electrode 110 according to a sputtering time of the organic light-emitting display apparatus 1 shown in FIG. 1.

A horizontal axis of the graph indicates the sputtering time, and a vertical axis of the graph indicates intensities of sputtered elements. Referring to FIG. 1 and FIG. 6, in an early stage of sputtering, indium (In) and oxygen (O) components included in the first protective layer 111 and/or the second protective layer 115t were mainly detected, then non-silver metal oxide X-oxide was detected, and then silver (Ag) and non-silver metal X were detected (here, non-silver metal X is antimony or bismuth). That is, as illustrated in FIG. 6, performing sputtering can check that the third layer 113 including non-silver metal X and the second layer 114 that is the oxide layer of the third layer 113 were formed between the second protective layer 115 and the first layer 112 including silver. In the same manner, in case of the second exemplary embodiment as shown in FIG. 4, it may be possible to check the second layer 214 that is the oxide layer of the non-silver metal X was formed between the second protective layer 215 and the first layer 212a including a silver and non-silver metal X alloy.

As described above, the second layer 114, 214 is a protective layer for protecting the first layer 112, 212a including silver, and prevents effusion of silver through the surface of the second protective layer 115, 215 and agglomeration of silver on the surface of the second protective layer 115.

As a result of the test performed in a reverse aging condition of at least 20 V, the first electrode 110 of FIG. 1 that was manufactured by using the method described with reference to FIGS. 2A and 2B has a 45% improvement in yield rate with respect to progressive dark spots, compared to the anode structure as illustrated in FIGS. 3A and 3B. As described above, the one or more of the above exemplary embodiments provide the organic light-emitting display apparatus having an improved display quality and an improved yield rate, and the method of manufacturing the organic light-emitting display apparatus.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display apparatus, comprising:
    a substrate;
    a first electrode formed on the substrate;
    an emission layer formed on the first electrode;
    a second electrode formed on the emission layer,
    wherein the first electrode comprises:
        a first layer including silver (Ag);
        a second layer disposed on the first layer and comprising an oxide of a non-silver metal; and
        a second protective layer that is formed between the second layer and the emission layer and comprising transparent conductive oxide.

2. The organic light-emitting display apparatus of claim 1, wherein the non-silver metal comprises at least one selected from antimony (Sb) and bismuth (Bi).

3. The organic light-emitting display apparatus of claim 1, further comprising:
    a third layer,
    wherein the third layer is formed between the first layer and the second layer, and
    wherein the third layer comprises the non-silver metal.

4. The organic light-emitting display apparatus of claim 1, further comprising:
    a first protective layer,
    wherein the first protective layer is formed between the substrate and the first layer, and
    wherein the first protective layer comprises transparent conductive oxide.

5. The organic light-emitting display apparatus of claim 4, wherein the first protective layer comprises at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

6. The organic light-emitting display apparatus of claim 1, wherein the second protective layer comprises at least one material selected from the group consisting of ITO, IZO, ZnO, $In_2O_3$, IGO, and AZO.

7. The organic light-emitting display apparatus of claim 1, wherein the first layer comprises the silver and the non-silver metal alloy.

8. The organic light-emitting display apparatus of claim 7, wherein the non-silver metal comprises at least one selected from antimony (Sb) and bismuth (Bi).

9. The organic light-emitting display apparatus of claim 1, wherein the second electrode is a reflective electrode.

10. The organic light-emitting display apparatus of claim 9, wherein light emitting from the emission layer is discharged toward the substrate.

11. The organic light-emitting display apparatus of claim 1, wherein the second electrode is a transparent electrode.

12. The organic light-emitting display apparatus of claim 11, wherein light emitting from the emission layer is discharged away from the substrate.

13. The organic light-emitting display apparatus of claim 1, wherein the first electrode is an anode, and the second electrode is a cathode.

14. A method of manufacturing an organic light-emitting display apparatus, the method comprising:
    forming a first layer comprising silver on a substrate;
    forming a second layer comprising a non-silver metal on the first layer;
    forming a protective layer comprising transparent conductive oxide on the layer comprising the non-silver metal;
    forming an emission layer on the protective layer;
    forming an electrode on the emission layer; and
    forming, by performing a thermal treatment, a third layer comprising an oxide of the non-silver metal between the protective layer and the second layer.

15. The method of claim 14, wherein the second layer comprises at least one selected from antimony (Sb) and bismuth (Bi).

16. The method of claim 14, further comprising forming a fourth layer comprising a transparent conductive oxide between the substrate and the first layer.

17. A method of manufacturing an organic light-emitting display apparatus, the method comprising:
    forming a first layer comprising an alloy of silver and a non-silver metal on a substrate;
    forming a protective layer comprising a transparent conductive oxide on the first layer;
    forming an emission layer on the protective layer;
    forming a second electrode on the emission layer; and
    forming, by performing a thermal treatment, a second layer comprising an oxide of the non-silver metal between the protective layer and the first layer.

18. The method of claim 17, wherein the non-silver metal comprises at least one selected from antimony (Sb) and bismuth (Bi).

19. The method of claim 17, further comprising:
    forming a third layer comprising a transparent conductive oxide between the substrate and the first layer.

* * * * *